United States Patent
Hatakeyama et al.

(10) Patent No.: US 7,184,296 B2
(45) Date of Patent: Feb. 27, 2007

(54) MEMORY DEVICE

(75) Inventors: Atsushi Hatakeyama, Kawasaki (JP);
Toshimi Ikeda, Kawasaki (JP);
Nobutaka Taniguchi, Kawasaki (JP);
Akira Kikutake, Kawasaki (JP);
Kuninori Kawabata, Kawasaki (JP);
Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/069,940

(22) Filed: Mar. 3, 2005

(65) Prior Publication Data

US 2005/0141306 A1 Jun. 30, 2005

Related U.S. Application Data

(63) Continuation of application No. PCT/JP03/01774, filed on Feb. 19, 2003.

(51) Int. Cl.
*G11C 11/00* (2006.01)

(52) U.S. Cl. .................... 365/148; 365/203; 365/207

(58) Field of Classification Search .............. None
See application file for complete search history.

(56) References Cited

U.S. PATENT DOCUMENTS

| | | | | |
|---|---|---|---|---|
| 5,148,063 A | * | 9/1992 | Hotta | 365/185.21 |
| 5,771,197 A | * | 6/1998 | Kim | 365/210 |
| 5,886,937 A | * | 3/1999 | Jang | 365/203 |
| RE36,579 E | * | 2/2000 | Pascucci et al. | 365/185.21 |
| 6,052,307 A | * | 4/2000 | Huber et al. | 365/185.21 |
| 6,069,831 A | * | 5/2000 | Jang et al. | 365/210 |
| 6,087,859 A | * | 7/2000 | Lee et al. | 327/51 |
| 2002/0009009 A1 | * | 1/2002 | Ahmed et al. | 365/207 |
| 2002/0105831 A1 | * | 8/2002 | Lee et al. | 365/185.21 |

FOREIGN PATENT DOCUMENTS

| | | |
|---|---|---|
| JP | 10-209304 A | 8/1998 |
| JP | 10-261298 A | 9/1998 |
| JP | 2002-237194 A | 8/2002 |

* cited by examiner

*Primary Examiner*—Amir Zarabian
*Assistant Examiner*—Kretelia Graham
(74) *Attorney, Agent, or Firm*—Arent Fox PLLC

(57) ABSTRACT

A memory device has a data line (DATA-BUS) for connection to a memory cell, a reference line (Reference-BUS) for reference, a precharge circuit (101), a load circuit (102), and an amplifier circuit (103). The precharge circuit is connected to the data line and the reference line and configured to precharge the data line and the reference line. The load circuit is connected to the data line and the reference line and configured to apply a first constant current to the data line and apply a second constant current which is smaller than the first constant current to the reference line. The amplification circuit is connected to the data line and the reference line and configured to amplify a differential voltage between the data line and the reference line.

20 Claims, 9 Drawing Sheets

F I G. 1
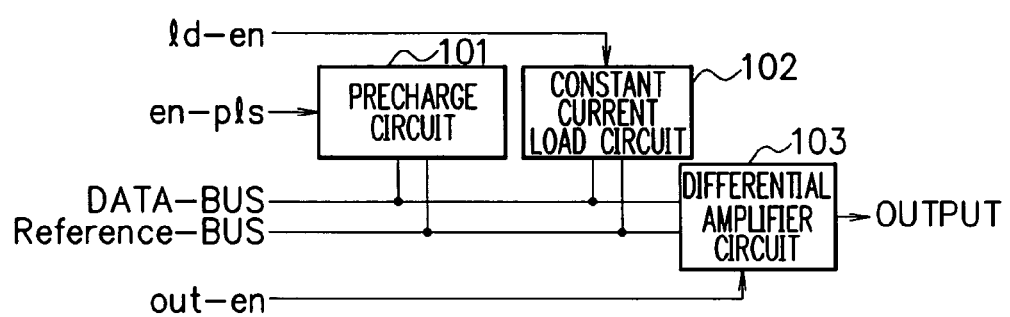

MEMORY DEVICE

This application is a continuing application, filed under 35 USC §111(a), of International application PCT/JP03/01774, filed Feb. 19, 2003

TECHNICAL FIELD

The present invention relates to a memory device, and particularly relates to a technology for amplifying a differential voltage between a data line and a reference line connected to a memory cell.

BACKGROUND ART

FIG. 12 shows an example of a memory cell of a nonvolatile semiconductor memory device. Here, an example of a nonvolatile semiconductor memory device that is generally called a flash memory is shown.

A cell of the flash memory is constituted of one MOS field-effect transistor (FET) which has a floating gate, a control gate, a source and a drain, and is capable of retaining two types of states by storing or not storing a negative charge in the floating gate. Hereinafter, a transistor refers to a MOS field-effect transistor unless otherwise noted.

In the memory cell, the control gate is connected to a word line WL, the source is connected to a reference potential (ground) VSS, and the drain is connected to a bit line BL. When the memory cell is selected, the word line WL is raised to high electric potential, and a voltage is applied to the bit line BL. At this time, if a negative charge is stored in the floating gate, the transistor remains in an OFF state and does not pass a current. However, if the negative charge is not stored, the transistor is in an ON state and therefore passes a current of the order of ten and a few μA from the bit line BL to the reference potential VSS.

FIG. 13 shows an overall view of a nonvolatile semiconductor memory device including the memory cell. Inputted address information of plural bits can be divided into an address A1 of plural bits and an address A2 of plural bits. A memory cell array 1301 has plural memory cells MC which are two-dimensionally arranged. Each memory cell MC corresponds to the memory cell in FIG. 12 and is connected to the word line WL and the bit line BL.

A decoder 1302 decodes the address A1 and activates a predetermined word line WL to have a high electric potential. By raising one word line WL to high electric potential by the address A1, a memory cell MC connected to this word line WL is selected.

A column selecting circuit 1303 connects one of the plural bit lines BL to a data bus (line) DATA-BUS based on the address A2. In order words, the bit line BL is selected by the address A2 and connected to the data bus DATA-BUS, and eventually one memory cell MC is connected to a sense circuit 1304. The sense circuit 1304 applies a voltage to a bit line BL connected to the selected memory cell MC and detects whether or not a current can flow thereto, and outputs a result thereof as voltage information of high level or low level to an output line OUTPUT.

FIG. 14 shows a configuration example of the sense circuit 1304 in the prior art. This sense circuit is divided into preamplifier units 1401, 1402 which perform current-voltage conversion and a main amplifier unit (differential amplifier circuit) 1403 which detects a minute differential voltage between two inputs.

The preamplifier unit 1401 has the following configuration. In a p-channel MOS transistor m01, a gate is connected to an activation signal /pre-en, a source is connected to a power supply potential, and a drain is connected to a node node-D. In this description, a symbol "/" denotes logical negation. The activation signal /pre-en is activated by a low level. In an n-channel MOS transistor m02, a gate is connected to the output of an inverter x01, a source is connected to a data bus DATA-BUS, and a drain is connected to the node node-D. The input of the inverter x01 is connected to the data bus DATA-BUS. In an n-channel MOS transistor m03, a gate is connected to the activation signal /pre-en, a source is connected to the ground potential, and a drain is connected to the data bus DATA-BUS.

The preamplifier unit 1402 has the same configuration as the above-described preamplifier circuit 1401. While the preamplifier unit 1401 is connected to the data bus DATA-BUS, the preamplifier unit 1402 is connected to a reference bus (line) Reference-BUS instead. The reference bus Reference-BUS is connected to a reference memory cell. Further, while the preamplifier unit 1401 is connected to the node node-D, the preamplifier unit 1402 is connected to a node node-R instead.

The differential amplifier circuit 1403 turns to an enable state by an enable signal out-en, and then amplifies a differential voltage between two input signals of the nodes node-D and node-R and outputs it to an output line OUTPUT.

The preamplifier unit 1401 is also generally referred to as a CASCODE circuit, which varies the voltage level of the node node-D as an output according to the current flowing in the data bus DATA-BUS. As shown in FIG. 15, it is activated by a change of the activation signal /pre-en from a high level (hereinafter, denoted by H) to a low level (hereinafter, denoted by L), and first the transistors m01 and m02 are both turned on to apply a voltage to the data bus DATA-BUS. The data bus DATA-BUS is connected to the bit line BL, so that finally the voltage is also applied to the bit line BL. In this state, if the memory cell MC is in an OFF state, the electric potential of the data bus DATA-BUS rises to a threshold voltage of the inverter x01 so that the inverter x01 inverts its output from H to L, thereby turning off the transistor m02. Then, since the path for a charge to pass through no longer exists, the node node-D rises to a power supply level. On the other hand, if the memory cell MC is in an ON state, the electric potential of the data bus DATA-BUS does not rise to the threshold voltage of the inverter x01, and thus the transistor m02 is not turned off. Then, the node node-D does not rise to the power supply level and settles down to an intermediate electric potential that is determined by on-resistance ratios of the transistors m01, m02 and the transistor of the memory cell MC.

The preamplifier unit (CASCODE circuit) 1402 is connected to the reference bus Reference-BUS instead of the data bus DATA-BUS and outputs a reference potential to the node node-R. To the reference bus Reference-BUS, a reference memory cell, which is specially prepared for sensing, is connected. This reference memory cell is adjusted to pass a current that is approximately half of a current passed by the normal memory cell MC in the ON state, and also the electric potential of the node node-R is adjusted to be exactly the middle between the voltage of the node node-D at the time that the memory cell MC is in the ON state and the voltage of the node node-D at the time that the memory cell MC is in the OFF state.

In FIG. 15, voltage waveforms of the data bus DATA-BUS and the nodes node-D, node-R at this time are shown. For the voltages of the data bus DATA-BUS and the node node-D, waveforms at the time that the memory cell is OFF are shown as a data bus voltage DATA-BUS-OFF and a node voltage node-D-OFF by solid lines, and waveforms at the time that the memory cell is ON are shown as a data bus voltage DATA-BUS-ON and a node voltage node-D-ON by dotted lines.

The voltage difference between the nodes node-D and node-R is not so large. Therefore, in the sense circuit, the differential amplifier circuit 1403 which amplifies the differential voltage between them is prepared as a main amplifier. Various types of this differential amplifier circuit 1403 may exist, and they can be commonly seen in a generic semiconductor device. The differential amplifier circuit 1403 is activated by a change of the enable signal out-en from L to H and detects a voltage difference between the nodes node-D and node-R and outputs information to the output line OUTPUT.

Generally, in a sense circuit on a semiconductor device, a certain level of imbalance occurs due to manufacturing variability of constituting elements thereof. Accordingly, in order to accurately detect a differential voltage between two signals, output of a sensing result needs to be put off until a differential voltage equal to or higher than the imbalance occurs at a sense circuit input. In the case of the example in FIG. 14, activation of the differential amplifier circuit 1403 needs to be put off until an adequate differential voltage occurs between the data bus DATA-BUS and the reference bus Reference-BUS. However, a semiconductor memory device has a large total number of memory cells in one chip owing to the advance in miniaturization, and parasitic capacitances in the bit line BL and data bus DATA-BUS becomes large accordingly, so that the potential variation in the data bus DATA-BUS becomes slow. This makes the time until an adequate differential voltage occurs between the data bus DATA-BUS and the reference bus Reference-BUS become long, and thus the time until output of a sensing result becomes long. As a result, there arises a concern that an access speed from input of an address to output of data becomes slow.

In FIG. 16, enlarged voltage waveforms of the data bus DATA-BUS and waveforms of load currents to be sent to the data bus DATA-BUS are shown. A load current I-DATA-BUS-ON is a load current at the time that the memory cell is in the ON state, and the load current I-DATA-BUS-OFF is a load current at the time that the memory cell is in the OFF state. A differential voltage needed at the sense circuit input is denoted by $\Delta V$. Since the reference bus Reference-BUS is adjusted to be an intermediate electric potential between the data bus voltage DATA-BUS-OFF at the time that the memory cell is in the OFF state and the data bus voltage DATA-BUS-ON at the time that the memory cell is in the ON state, a time for the differential voltage of the data bus DATA-BUS in both the states to be $(2 \times \Delta V)$ is the time when the sense circuit can produce an output.

When the preamplifier unit 1401 is activated, a large peak current appears once in the load currents I-DATA-BUS-ON, I-DATA-BUS-OFF, and the data bus voltages DATA-BUS-ON, DATA-BUS-OFF are raised at relatively high speed. However, when the data bus voltages DATA-BUS-ON, DATA-BUS-OFF come to a certain level, the load currents I-DATA-BUS-ON, I-DATA-BUS-OFF become small, and thus the rises of the data bus voltages DATA-BUS-ON, DATA-BUS-OFF become slow. Thereafter, if the memory cell is in the ON state, the load current I-DATA-BUS-ON and a cell current become balanced and thus the rise of the electric potential of the data bus DATA-BUS stops in an early stage, but if the memory cell is in the OFF state, the data bus voltage DATA-BUS-OFF continues to rise slowly. However, as it rises, the transistor m02 is turned OFF and the load current I-DATA-BUS-OFF decreases to be 0 (zero) at last, and soon the rise of the data bus voltage DATA-BUS-OFF stops. For the voltage of the reference bus Reference-BUS, the load current I-Reference-BUS becomes balanced with the reference memory cell current, and the rise of an electric potential thereof stops at approximately the middle between the data bus voltage DATA-BUS-ON at the time that the memory cell is in the ON state and the data bus voltage DATA-BUS-OFF at the time that the memory cell is in the OFF state. By such a difference in operations, the differential voltage $\Delta V$ is generated between the data bus DATA-BUS and the reference bus Reference-BUS.

The speed to generate this difference in electric potential is determined by parasitic capacitances in the data bus DATA-BUS and the bit line BL and the amount of a load current flowing into them. Even when the parasitic capacitance increases, variation of the electric potential of the data bus DATA-BUS does not become slow if the current can be increased in proportion thereto, and thus the decrease in access speed does not occur. However, a current value which generates a differential voltage in the data bus DATA-BUS is limited equal to or lower than an ON current of the memory cell. In this method, it gradually decreases as the differential voltage increases, which makes the increase of the necessary differential voltage further slower. The upper limit of a current flowing in the memory cell has a limit that is determined depending on its manufacturing process, and thus it cannot be increased easily.

SUMMARY OF THE INVENTION

An object of the present invention is to provide a memory device capable of improving an access speed while using an ordinary memory cell.

According to an aspect of the present invention, there is provided a memory device which has a data line for connection to a memory cell, a reference line for reference, a precharge circuit connected to the data line and the reference line and configured to precharge the data line and the reference line, a load circuit connected to the data line and the reference line and configured to apply a first constant current to the data line and apply a second constant current which is smaller than the first constant current to the reference line, and an amplification circuit connected to the data line and the reference line and configured to amplify a differential voltage between the data line and the reference line.

By applying the first constant current to the data bus and applying the second constant current which is smaller than the first constant current to the reference bus, a differential voltage between the data bus and the reference bus becomes large quickly and a time for the memory device to produce an output becomes fast, so that an access speed can be accelerated. Further, since an ordinary memory cell is used, the access speed of a memory device can be improved without causing any cost increase in manufacturing steps.

BRIEF DESCRIPTION OF THE DRAWINGS

FIG. 1 is a block diagram showing a configuration example of a sense circuit according to a first embodiment of the present invention;

DETAILED DESCRIPTION OF THE PREFERRED EMBODIMENTS

First Embodiment

Figure 12:
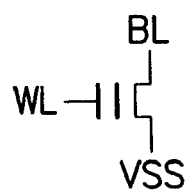
FIG. 12 is a diagram showing an example of a nonvolatile memory cell.
Figure 13:
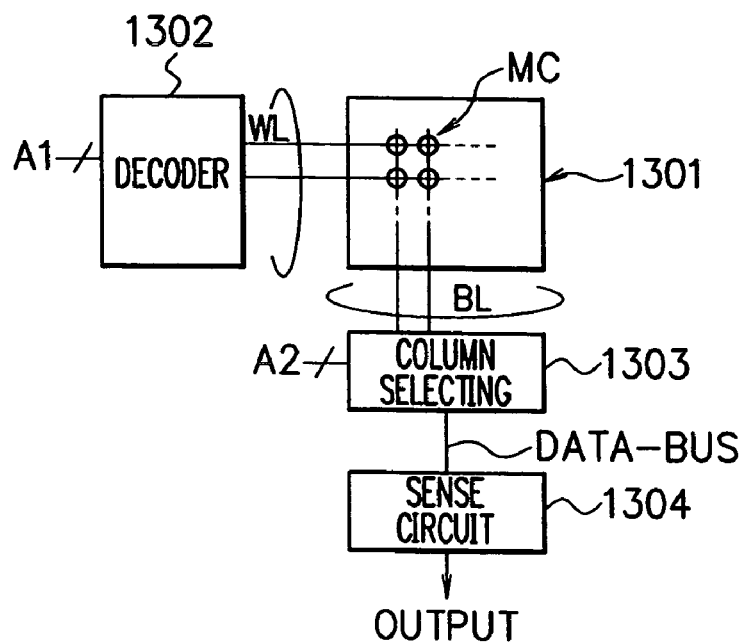
FIG. 13 is a view showing the overall configuration of a nonvolatile semiconductor memory device.
Figure 14:
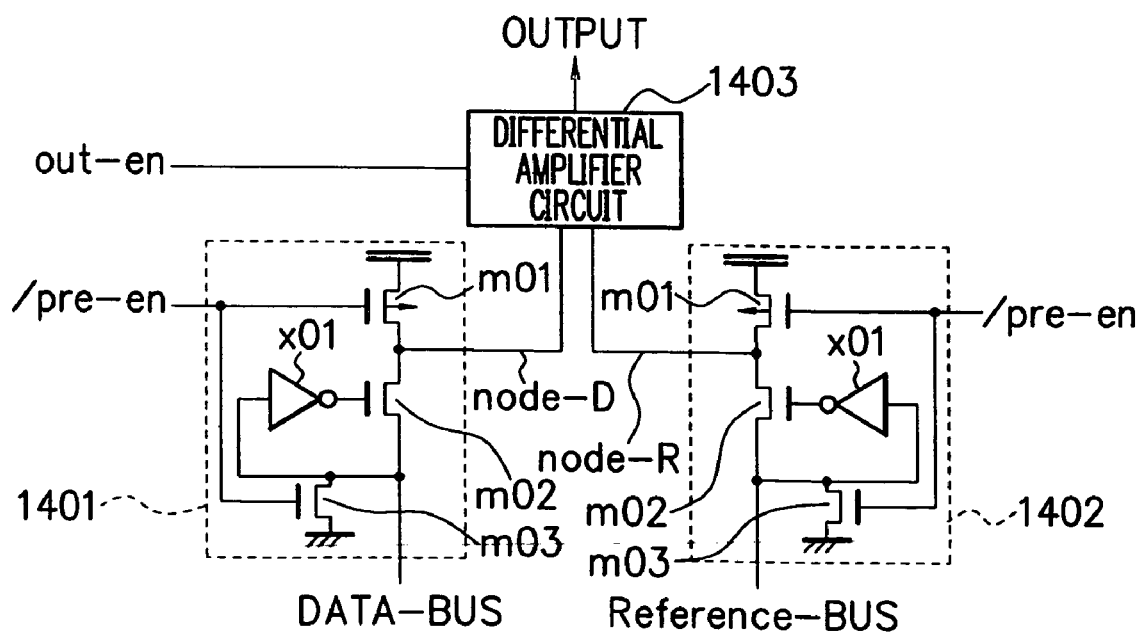
FIG. 14 is a circuit diagram showing a sense circuit according to the prior art.
Figure 15:
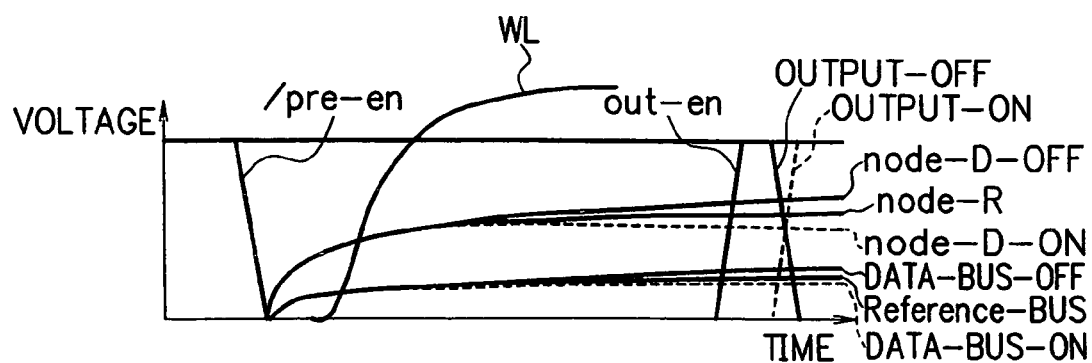
FIG. 15 is a view showing operational waveforms of a sense circuit according to the prior art.

FIG. 13 shows a configuration example of a nonvolatile semiconductor memory device (memory device) according to a first embodiment of the present invention. FIG. 12 shows an example of a nonvolatile memory cell MC in FIG. 13. Details of these are the same as the above description.

FIG. 1 shows a configuration example of a sense circuit 1304 in FIG. 13. A data bus (line) DATA-BUS is a line for connection to the memory cell MC in FIG. 13. A reference bus (line) Reference-BUS is a line for reference. A precharge circuit 101 is connected to a data bus DATA-BUS and a reference bus Reference-BUS and configured to be activated by an activation pulse en-pls to precharge the data bus DATA-BUS and the reference bus Reference-BUS. A constant current load circuit 102 is connected to the data bus DATA-BUS and the reference bus Reference-BUS and configured to be activated by an activation signal ld-en to apply a constant current I-DATA-BUS (FIG. 3) to the data bus DATA-BUS and a constant current I-Reference-BUS (FIG. 3) that is smaller than the constant current I-DATA-BUS to the reference bus Reference-BUS. The constant current I-Reference-BUS is preferred to be ½ of the constant current I-DATA-BUS. A differential amplifier circuit 103 is connected to the data bus DATA-BUS and the reference bus Reference-BUS and configured to be turned to an enable state by an enable signal out-en so as to amplify a differential voltage between the data bus DATA-BUS and the reference bus Reference-BUS and output it to an output line OUTPUT. The other end of the data bus DATA-BUS is connectable to a bit line BL of the memory cell MC. The other end of the reference bus Reference-BUS is open.

Figure 2:
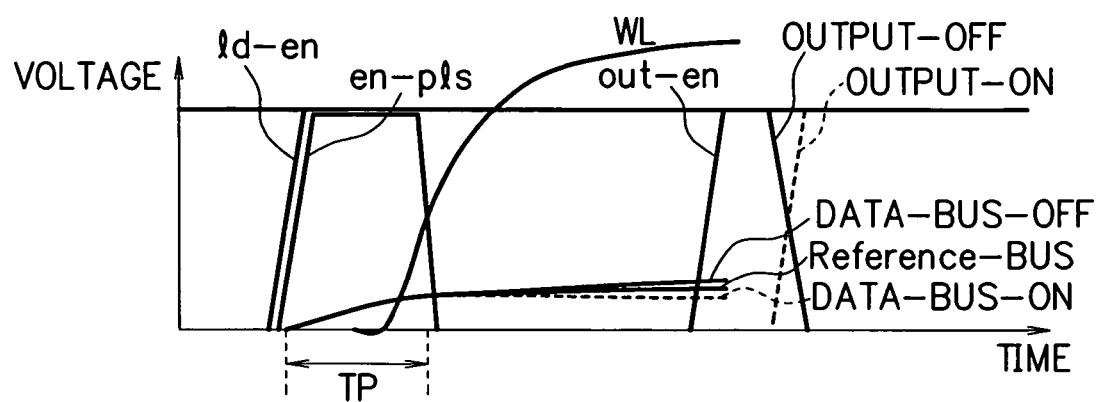
FIG. 2 is a view showing operational waveforms of the sense circuit according to the first embodiment.

FIG. 2 shows operational waveforms of the sense circuit in FIG. 1. Data bus voltages DATA-BUS-ON and DATA-BUS-OFF are voltages of the data bus DATA-BUS at the time that the memory cell MC is in an ON state and an OFF state, respectively. The output voltages OUTPUT-ON and OUTPUT-OFF are voltages of the output line OUTPUT at the time that the memory cell MC is in the ON state and the OFF state, respectively.

First, at the time when starting a precharge period TP, the activation signal ld-en and the activation pulse en-pls are changed from L to H. The activation pulse en-pls changes to H by a one-shot pulse during the precharge period TP. Then, the precharge circuit 101 precharges the data bus DATA-BUS and the reference bus Reference-BUS. The activation signal ld-en remains H during and after the precharge. Then, the load circuit 102 supplies a constant current to the data bus DATA-BUS and the reference bus Reference-BUS. Incidentally, in the view, H of the activation pulse en-pls and H of the activation signal ld-en are distinguished by shifting them, but H of the both are practically the same level.

After the precharge is started, a word line WL is turned from L to H to select a memory cell MC. Further, a predetermined bit line BL is connected to the data bus DATA-BUS to select the memory cell MC in a two-dimensional matrix shape. Depending on whether the selected memory cell MC is in the ON state or the OFF state, a data bus voltage DATA-BUS-ON or DATA-BUS-OFF is generated in the data bus DATA-BUS. The voltage of the reference bus Reference-BUS becomes an intermediate voltage between the voltages DATA-BUS-ON and DATA-BUS-OFF.

Next, the enable signal out-en is turned from L to H. Then, the differential amplifier circuit 103 changes to the enable state to amplify a differential voltage between two inputs of the data bus DATA-BUS and the reference bus Reference-BUS and output it to the output line OUTPUT. Depending on whether the selected memory cell MC is in the ON state or the OFF state, a voltage OUTPUT-ON or OUTPUT-OFF is generated in the output line OUTPUT. The voltage OUTPUT-ON becomes H. The voltage OUTPUT-OFF becomes L.

Figure 3:
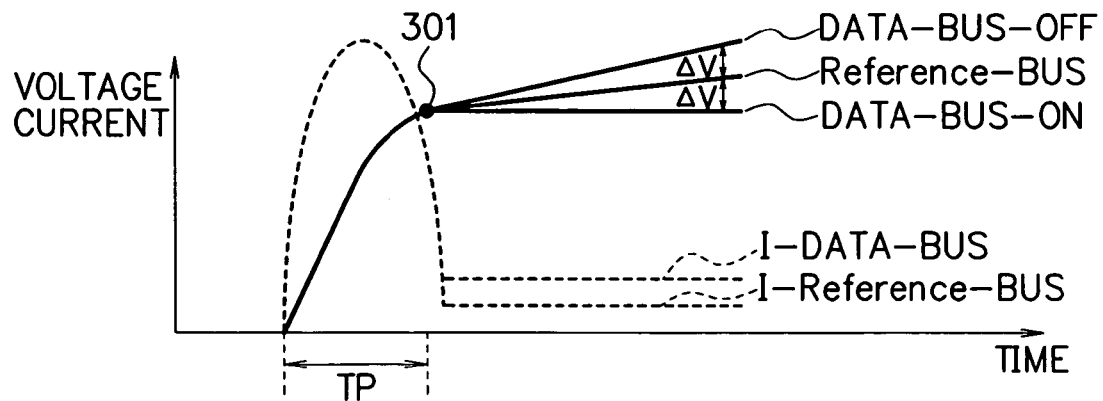
FIG. 3 is a waveform view showing voltages and load currents of a data bus and a reference bus according to the first embodiment.
Figure 16:
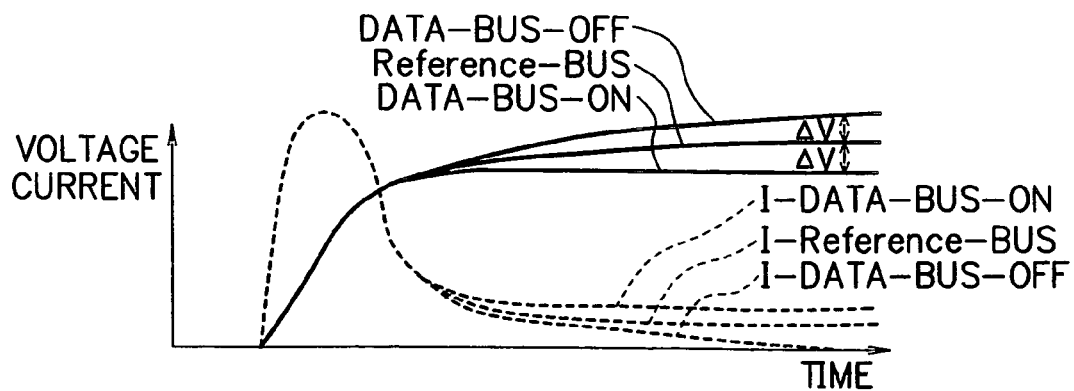
FIG. 16 is a view showing an enlargement of data bus waveforms in FIG. 15 to which load current waveforms are added.

FIG. 3 is an enlarged waveform view of voltages and load currents of the data bus DATA-BUS and the reference bus Reference-BUS in FIG. 2. When the precharge circuit 101 is activated, a large peak current once flows as the current I-DATA-BUS into the data bus DATA-BUS and raises the data bus voltages DATA-BUS-ON, DATA-BUS-OFF. This current peak is approximately the same as a peak current in FIG. 16. In this embodiment, when the data bus voltages DATA-BUS-ON, DATA-BUS-OFF rise to a predetermined voltage, the precharge circuit 101 is deactivated, and the load current I-DATA-BUS for the data bus DATA-BUS becomes controllable by the constant current load circuit 102. In FIG. 16, a CASCODE circuit 1401 reduces the load currents I-DATA-BUS-ON, I-DATA-BUS-OFF as the electric potential of the data bus DATA-BUS rises. On the other hand, this constant current load circuit 102 keeps applying the constant current I-DATA-BUS regardless of the electric potential of the data bus DATA-BUS. This load current I-DATA-BUS is set to be approximately the same as a current value which is passed by a memory cell in an ON state. If the memory cell is in the ON state, the load current I-DATA-BUS is cancelled out by a cell current, so that the data bus voltage DATA-BUS-ON becomes almost constant. Conversely, if the memory cell is in an OFF-state, the data bus voltage DATA-BUS-OFF keeps rising linearly.

The constant current load circuit 102 also keeps applying the constant current I-Reference-BUS to the reference bus Reference-BUS regardless of the electric potential of the reference bus Reference-BUS. This current I-Reference-BUS is set to be approximately a half of the current value passed by the memory cell. The reference bus Reference-BUS keeps rising linearly with an inclination that is half of that of the data bus voltage DATA-BUS-OFF at the time that the memory cell is in the OFF state. Since the data bus voltage DATA-BUS-OFF and the voltage of the reference bus Reference-BUS keep rising linearly, a differential voltage ΔV becomes large quickly, so that the time for the sense circuit to produce an output becomes fast, and thus the access speed can be accelerated.

Incidentally, the load current I-DATA-BUS to be sent to the data bus DATA-BUS is not required to completely correspond with the current passed by the memory cell, and it may be slightly larger. In such a case, the data bus voltage DATA-BUS-ON at the time that the memory cell is in the ON state slowly linearly rises, and with the same degree thereof, the rise of the data bus voltage DATA-BUS-OFF at the time that the memory cell is in the OFF state becomes quick. By adjusting the load current I-Reference-BUS for the reference bus Reference-BUS such that the voltage of the reference bus Reference-BUS becomes an exact intermediate electric potential between the both, exactly the same effect as above description can be obtained.

Figure 4:
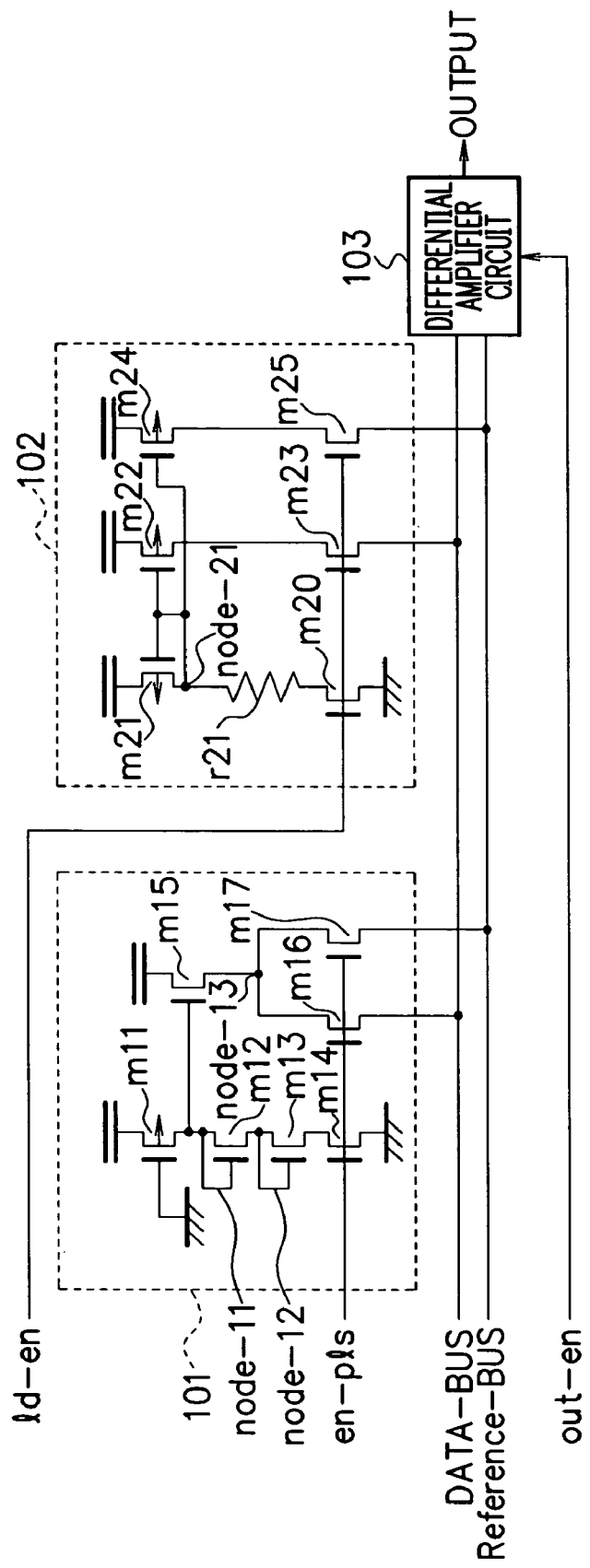
FIG. 4 is a circuit diagram showing a configuration example of a precharge circuit and a constant current load circuit according to the first embodiment.

FIG. 4 shows an example of a specific circuit diagram of the precharge circuit 101 and the constant current load circuit 102 in FIG. 1. First, the configuration of the precharge circuit 101 will be described. In a p-channel MOS transistor m11, a gate is connected to a reference potential (ground potential) VSS, a source is connected to a power supply potential, and a drain is connected to a node node-11. In an n-channel MOS transistor m12, a gate and a drain are both connected to the node node-11, and a source is connected to a node node-12. In an n-channel MOS transistor m13, a gate and a drain are both connected to the node node-12. In an n-channel MOS transistor m14, a gate is connected to an activation pulse en-pls, a source is connected to the ground potential, and a drain is connected to a source of the transistor m13. In an n-channel MOS transistor m15, a gate is connected to the node node-11, a drain is connected to the power supply potential, and a source is connected to a node node-13. In an n-channel MOS transistor m16, a gate is connected to the activation pulse en-pls, a drain is connected to the node node-13, and a source is connected to a data bus DATA-BUS. In an n-channel MOS transistor m17, a gate is connected to the activation pulse en-pls, a drain is connected to the node node-13, and a source is connected to a reference bus Reference-BUS.

Next, the configuration of a constant current load circuit 102 will be described. In each of p-channel MOS transistors m21, m22, m24, a gate is connected to a node node-21 and a source is connected to the power supply potential. The transistors m21 and m22 have the same gate width. The gate width of the transistor m24 is ½ of the gate width of the gates m21, m22. The drain of the transistor m21 is connected to the node node-21. Gates of n-channel MOS transistors m20, m23, m25 are connected to an activation signal ld-en. A source of the transistor m20 is connected to the ground potential. A resister r21 is connected between the node node-21 and a drain of the transistor m20. In the transistor m23, a drain is connected to a drain of the transistor m22, and a source is connected to the data bus DATA-BUS. In the transistor m25, a drain is connected to a drain of the transistor m24, and a source is connected to a reference bus Reference-BUS.

Next, the operation of the precharge circuit 101 will be described. During standby, the activation pulse en-pls is L, so that the transistors m16 and m17 are OFF, and the precharge circuit 101 is disconnected from the data bus DATA-BUS and the reference bus Reference-BUS. When there is an access, the activation pulse en-pls rises to H to turn on the transistors m14, m16, m17. Since the transistors m12, m13 are diode-connected, the node node-12 rises by one amount (one time) of a transistor threshold voltage Vth from the ground potential, and the node node-11 increases by two amounts (two times) of the transistor threshold voltage Vth from the ground potential. The transistor m15 performs a source follower operation by an n channel, so that the node node-13 drops by one amount of the transistor threshold voltage Vth of the node node-11, in other words, rises by approximately one amount of the transistor threshold voltage Vth from the ground potential. Since there is almost no voltage drop by the transistors m16, m17, the data bus DATA-BUS and the reference bus Reference-BUS rise by approximately one amount of the transistor threshold voltage Vth from the ground potential. For the later-described differential amplifier circuit 103 (FIG. 5 and FIG. 6), amplification operation cannot be performed if input signals of the data bus DATA-BUS and the reference bus Reference-BUS are lower than VSS+Vth. The precharge circuit 101 thus configured prevents this. The data bus DATA-BUS and the reference bus Reference-BUS are precharged by supplying a voltage of integral multiple of one or more of the transistor threshold voltage. After the precharge operation is thus performed, the activation pulse en-pls drops to L, and the precharge circuit 101 is disconnected from the data bus DATA-BUS and the reference bus Reference-BUS.

Next, the operation of the constant current load circuit 102 will be described. During standby, the activation signal ld-en is L, so that the transistors m23 and m25 are OFF, and the constant current load circuit 102 is disconnected from the data bus DATA-BUS and the reference bus Reference-BUS. Further, a current is not flowing in the resistor r21. When there is an access and the precharge is completed, the activation signal ld-en becomes H and first a current flows in the resistor r21. The resistance value of the resistor r21 is adjusted to pass approximately the same constant current I-DATA-BUS as the ON current of the memory cell. The transistors m21 and m22 constitute a mirror circuit, which allows the same constant current I-DATA-BUS as described above flows in the transistor m22 without depending on a drain voltage value. Eventually, the constant current I-DATA-BUS flows into the data bus DATA-BUS. The transistor m24 similarly constitutes a mirror circuit with the transistor m21, but its channel width (gate width) is half of that of the transistor m21. Therefore, in the transistor m24, a constant current I-Reference-BUS flows without depending on a drain voltage. Eventually, the constant current I-Reference-BUS flows into the reference bus Reference-BUS. The size of the constant current I-Reference-BUS is ½ of the constant current I-DATA-BUS. If the memory cell is in the ON state, the load current I-DATA-BUS is cancelled out by the memory cell current so that the data bus voltage DATA-BUS-ON becomes almost constant. On the other hand, if the memory cell is in the OFF state, the data bus voltage DATA-BUS-OFF keeps rising linearly. The reference bus Reference-BUS is adjusted to have the same capacitance as that of the data bus DATA-BUS. Since the current I-Reference-BUS is a current that is half of the current I-DATA-BUS to be sent to the data bus DATA-BUS, the voltage of the reference bus Reference-BUS rises with an inclination that is half of that of the data bus voltage DATA-BUS-OFF at the time that the memory cell is in the OFF state. Thus, the operational waveforms in FIG. 3 are obtained.

In this embodiment, as the differential amplifier circuit 103, one used in an ordinary semiconductor device can be used. For example, it may be a current mirror amplifier shown in FIG. 5 or may be a latch-type amplifier shown in FIG. 6. Further, it may be a two-stage configuration including a preamplifier and a main amplifier, in which the preamplifier is a current mirror amplifier and the main amplifier is a latch-type, or the preamplifier and the main amplifier are both a current mirror amplifier.

Figure 5:
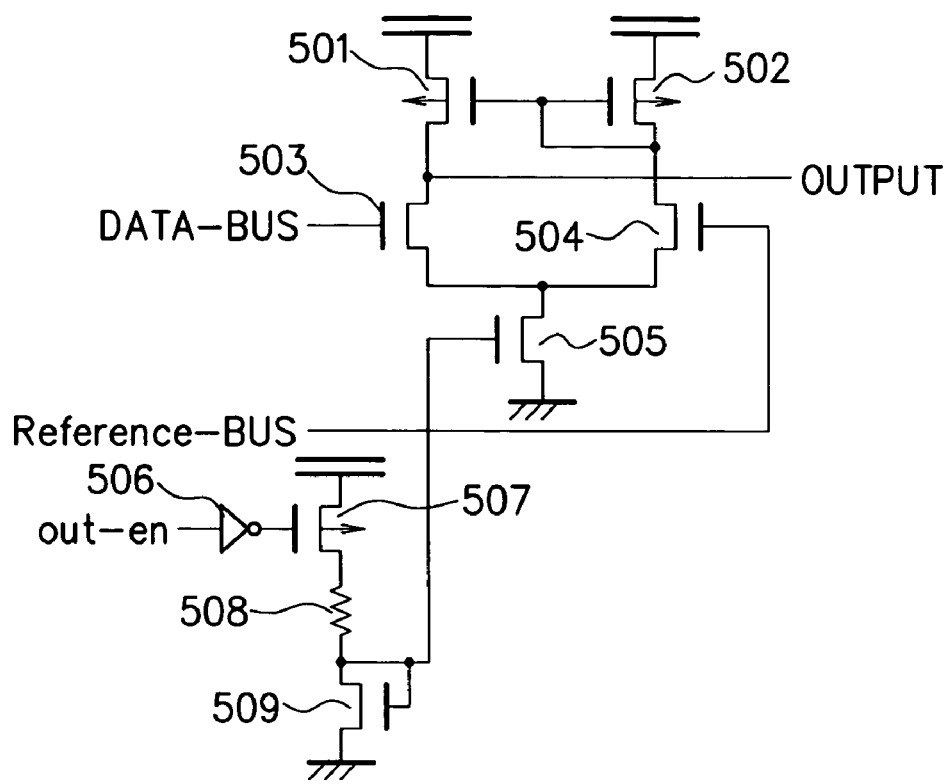
FIG. 5 is a circuit diagram showing a first example of a differential amplifier circuit according to the first embodiment.

FIG. 5 shows a first circuit example of the differential amplifier circuit 103. Sources of the p-channel MOS transistors 501 and 502 are connected to a power supply potential. A drain of the transistor 501 is connected to an output line OUTPUT. In the transistor 502, a gate and a drain are connected to each other. In an n-channel MOS transistor 503, a gate is connected to a data bus DATA-BUS, and a drain is connected to the output line OUTPUT. In an n-channel MOS transistor 504, a gate is connected to a reference bus Reference-BUS, and a drain is connected to gates of the transistors 501 and 502. In an n-channel MOS transistor 505, a drain is connected to sources of the transistors 503 and 504, and a source is connected to a ground potential. An inverter 506 outputs a logically inverted signal of the enable signal out-en. In a p-channel MOS transistor 507, a gate is connected to the output of the inverter 506 and a source is connected to a power supply potential. A resistor 508 is connected between a drain of the transistor 507 and a gate of the transistor 505. In an n-channel MOS transistor 509, a gate and a drain are both connected to the gate of the transistor 505 and a source is connected to the ground potential.

Figure 6:
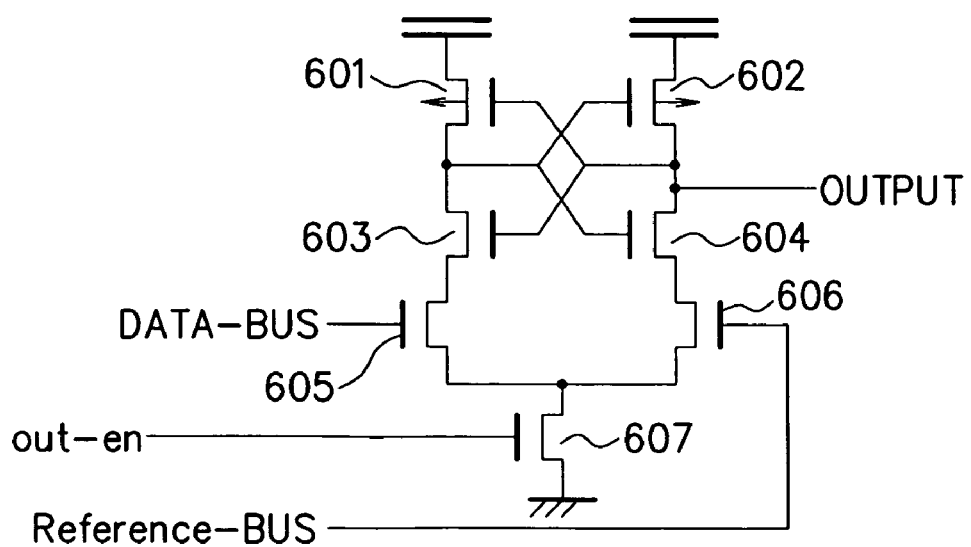
FIG. 6 is a circuit diagram showing a second example of the differential amplifier circuit according to the first embodiment.

FIG. 6 shows a second circuit example of the differential amplifier circuit 103. Sources of p-channel MOS transistors 601 and 602 are connected to a power supply potential. In an n-channel MOS transistor 603, a gate is connected to an output line OUTPUT, a drain is connected to a drain of the transistor 601, and a source is connected to a drain of an n-channel MOS transistor 605. A gate of the transistor 601 is connected to the output line OUTPUT. In an n-channel MOS transistor 604, a gate is connected to the drain of the transistor 601, a drain is connected to the output line OUTPUT, and a source is connected to a drain of an n-channel MOS transistor 606. A gate of the transistor 602 is connected to the drain of the transistor 601. In the n-channel MOS transistor 605, a gate is connected to a data bus DATA-BUS and a source is connected to a drain of an n-channel MOS transistor 607. In the n-channel MOS transistor 606, a gate is connected to a reference bus Reference-BUS and a source is connected to the drain of the transistor 607. In the transistor 607, a gate is connected to an enable signal out-en and a source is connected to a ground potential.

The memory cell current changes according to an operating environment such as a power supply voltage, temperature, and the like. For example, when the memory cell current increases, memory cell information is easily outputted, so that the operation margin of the differential amplifier circuit 103 can be improved. In the method of the first embodiment, a difference can be easily generated between the data bus DATA-BUS and the reference bus Reference-BUS according to an operating environment when the memory cell is in the ON state, but it is not effective when the memory cell is in the OFF state. Therefore, it cannot be said that a margin is improved in a total performance combining the ON state and the OFF state of the memory cell. If the load current I-DATA-BUS changes according to a change of the memory cell current, it is possible to improve the margin of the memory cell in both the ON state and OFF state. Such an embodiment will be described below as a second embodiment.

Second Embodiment

Figure 7:
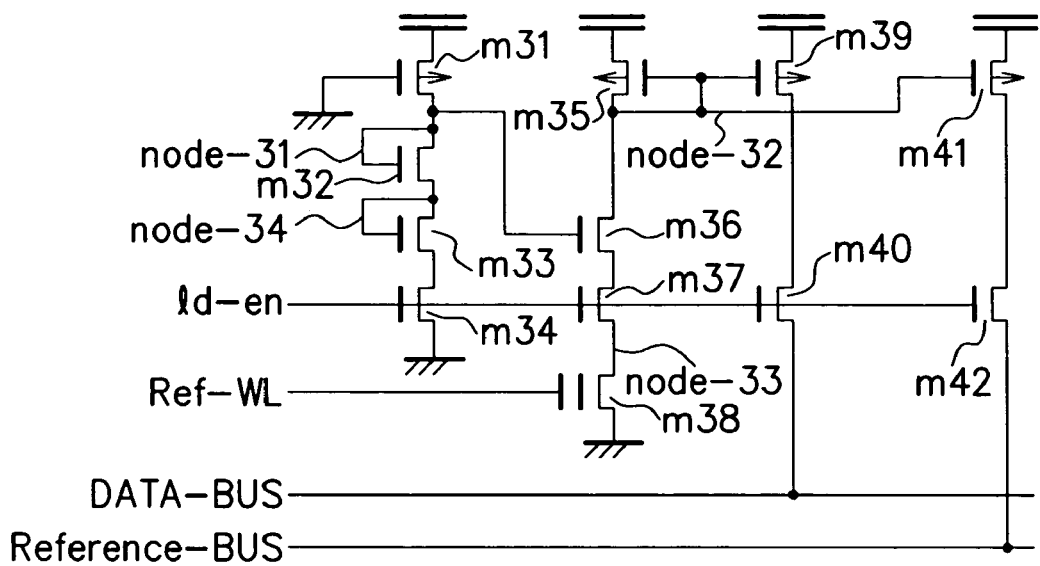
FIG. 7 is a circuit diagram showing a configuration example of a constant current load circuit according to a second embodiment of the present invention.

FIG. 7 is a configuration example of the constant current load circuit 102 (FIG. 1) according to a second embodiment of the present invention. In this embodiment, portions other than the constant current load circuit 102 in FIG. 1 are the same as in the first embodiment. First, the configuration of the constant current load circuit will be described. In a p-channel MOS transistor m31, a gate is connected to a ground potential, a source is connected to a power supply potential, and a drain is connected to a node node-31. In an n-channel MOS transistor m32, a gate and a drain are both connected to the node node-31 and a source is connected to a node node-34. In an n-channel MOS transistor m33, a gate and a drain are both connected to the node node-34. In an n-channel MOS transistor m34, a gate is connected to an activation signal ld-en, a source is connected to a ground potential, and a drain is connected to a source of the transistor m33.

In p-channel MOS transistors m35, m39, m41, sources are connected to the power supply potential and gates are connected to a node node-32. The transistors m35 and m39 have the same gate width. The gate width of the transistor m41 is ½ of the gate width of the transistors m35, m39. In the n-channel MOS transistor m36, a gate is connected to the node node-31 and a drain is connected to the node node-32. Gates of n-channel MOS transistors m37, m40, m42 are connected to the activation signal ld-en. In the transistor m37, a drain is connected to a source of the transistor m36 and a source is connected to a node node-33. In the transistor m40, a drain is connected to a drain of the transistor m39 and a source is connected to a data bus DATA-BUS. In the transistor m42, a drain is connected to a drain of the transistor m41 and a source is connected to a reference bus Reference-BUS.

Next, the operation of the load circuit will be described. The transistors m31 to m34 have the same configurations as the transistors m11 to m14 in FIG. 4. Accordingly, similarly to the above description, a voltage that is two times of a transistor threshold voltage Vth is generated in the node-31. Since the gate of the transistor m36 is connected to the node node-31, a voltage that is one time of the threshold voltage Vth is generated in the node node-33.

A transistor m38 is a reference memory cell (dummy memory cell) specially prepared for reference, and a negative charge is not stored in its floating gate. The reference memory cell m38 has the same structure as the above-described memory cell MC. When there is an access, a reference word line Ref-WL is increased to the same electric potential as that of a normal word line WL. Further, since the node node-33 is configured to be approximately one time of the threshold voltage Vth from a reference potential (ground potential), the same voltage as the control gate, the source and the drain of the selected memory cell MC is supplied to the control gate, the source and the drain of the reference memory cell m38 respectively, when the load circuit is activated. As a result, the reference memory cell m38 passes a current of the same value as the memory cell MC in an ON state. Even when the power supply voltage or temperature changes, the current flowing in the reference memory cell m38 becomes the same value as the memory cell MC in the ON state.

The current flowing in the reference memory cell m38 also flows in the transistor m35, and since the transistors m35 and m39 constitute a mirror circuit, the current of the same value flows in the data bus DATA-BUS. The transistors m35 and m41 also constitute a mirror circuit, but since the channel width of the transistor m41 is half of that of the transistor m35, a half current flows in the reference bus Reference-BUS. With such a configuration, when a power supply voltage or temperature changes to increase the memory cell current, the current flowing into the data bus DATA-BUS similarly increases. If the memory cell is in the ON state, the data bus DATA-BUS has a constant electric potential, and if it is in an OFF state, the electric potential of the data bus DATA-BUS rises at a speed in accordance with the amount of increased current, and the electric potential of the reference bus Reference-BUS also rises with a half inclination thereof. Therefore, the operational margin of the differential amplifier circuit can be improved.

A differential voltage $\Delta V$ (FIG. 3) needed at a sense circuit input in an ordinary semiconductor device is a value of approximately 10 mV. Therefore, the data bus DATA-BUS and the reference bus Reference-BUS must be configured not to have even a differential voltage of a few mV at the timing of just after the precharge is completed and just before the memory cell current starts to flow. In other words, in FIG. 3, three straight lines showing voltages of the data bus DATA-BUS and the reference bus Reference-BUS must converge at one point 301 in the beginning thereof. Although the data bus DATA-BUS and the reference bus Reference-BUS require such strict differential voltage control, the data bus DATA-BUS has a considerably long wiring, so that control of the voltage until its end is actually a very difficult task due to the effect of a parasitic resistance. For example, even if the data bus DATA-BUS has a desired electric potential at one point connected to the precharge circuit 101 (FIG. 4), it is possible that an electric potential at the other end of the data bus DATA-BUS is a few mV lower. Under such a circumstance, operation of the data bus DATA-BUS and the reference bus Reference-BUS with ideal waveforms similar to those shown in FIG. 3 is considerably difficult. An embodiment to solve this problem is shown next.

Third Embodiment

FIG. 8 to FIG. 11 show nonvolatile semiconductor memory devices according to a third embodiment of the present invention. This embodiment is to use one of two buses DATA-BUS-0 and DATA-BUS-1 as a data bus DATA-BUS and the other as a reference bus Reference-BUS by switching them. In this embodiment, only different points from the second embodiment will be described below. Other points in this embodiment are the same as in the second embodiment.

Figure 8:
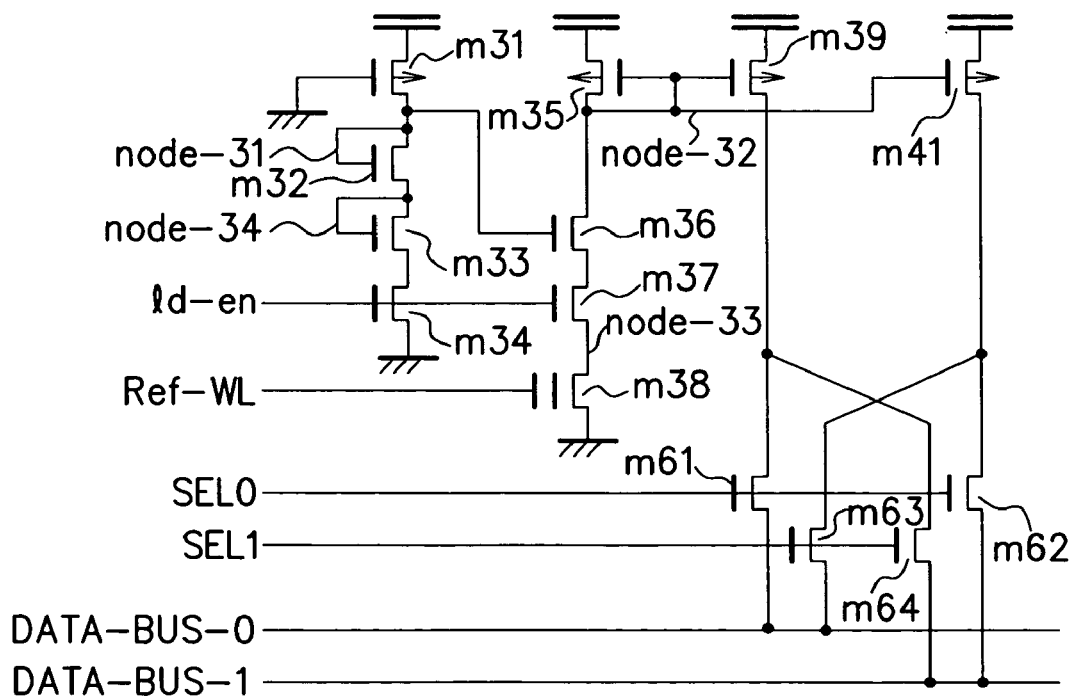
FIG. 8 is a circuit diagram showing a configuration example of a constant current load circuit according to a third embodiment of the present invention.

FIG. 8 shows a configuration example of the constant current load circuit 102 (FIG. 1). In this embodiment, instead of the data bus DATA-BUS and the reference bus Reference-BUS in the second embodiment (FIG. 7), the buses DATA-BUS-0 and DATA-BUS-1 are connected. Both of them are data buses for transmitting memory cell information, which are configured such that when memory cell information is transmitted to one of them, the memory cell information is not transmitted to the other one, according to addresses. Specifically, one is used as the data bus and the other is used as the reference bus. Accordingly, a parasitic capacitance and a parasitic resistance between the bus used as the data bus and the bus used as the reference bus become the same. Thus, a differential voltage between both the buses can be completely eliminated at the timing 301 (FIG. 3) of just after the precharge operation is completed and just before the memory cell current starts to flow. Even if an electric potential at a bus end of the data bus which is far from the precharge circuit 101 is a few mV lower, an electric potential at a bus end used as a reference bus should also be a few mV lower. Therefore, the decrease in electric potential at the bus ends does not generate a differential voltage between both the buses.

Furthermore, in this load circuit, transistors m61 to m64 are provided instead of the transistors m40 and m42 in the load circuit in FIG. 7. Other points of the load circuit in FIG. 8 are the same as in the load circuit in FIG. 7. In the n-channel MOS transistor m61, a gate is connected to a selection signal SEL0, a drain is connected to a drain of a transistor m39, and a source is connected to a bus DATA-BUS-0. In the n-channel MOS transistor m63, a gate is connected to a selection signal SEL1, a drain is connected to a drain of a transistor m41, and a source is connected to a bus DATA-BUS-0. In the n-channel MOS transistor m62, a gate is connected to the selection signal SEL0, a drain is connected to the drain of the transistor m41, and a source is connected to a bus DATA-BUS-1. In the n-channel MOS transistor m64, a gate is connected to the selection signal SEL1, a drain is connected to the drain of the transistor m39, and a source is connected to the bus DATA-BUS-1.

When memory cell information is transmitted to the bus DATA-BUS-0, the selection signal SEL0 becomes H to turn on the transistors m61, m62, and the selection signal SEL1 becomes L to turn off the transistors m63, m64. In this case, a current of the same value as the memory cell MC in the ON state is passed to one bus DATA-BUS-0 used as the data bus connected to the memory cell MC, and a half current thereof is passed to the other bus DATA-BUS-1 used as the reference bus.

On the other hand, when memory cell information is transmitted to the bus DATA-BUS-1, the selection signal SEL1 becomes H to turn on the transistors m63, m64, and the selection signal SEL0 becomes L to turn off the transistors m61, m62. In this case, a current of the same value as the memory cell MC in the ON state is passed to one bus DATA-BUS-1 used as the data bus connected to the memory cell MC, and a half current thereof is passed to the other bus DATA-BUS-0 used as the reference bus.

Figure 9:
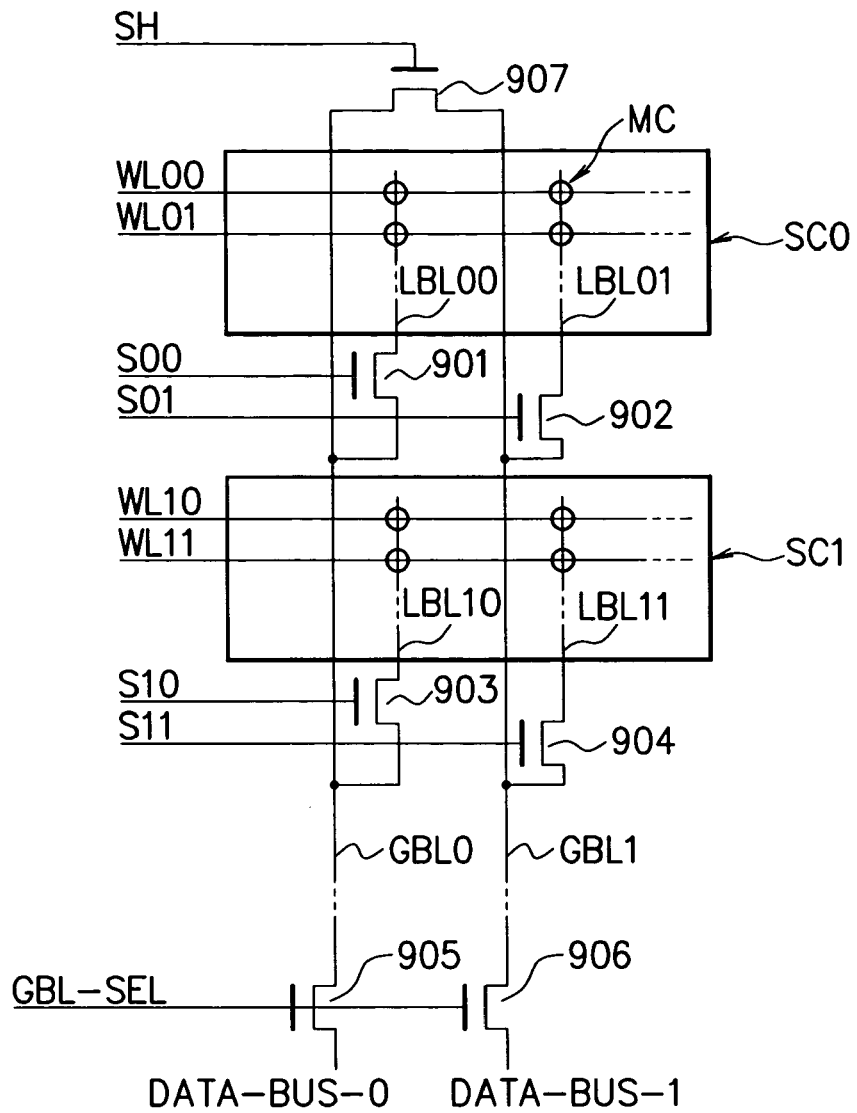
FIG. 9 is a diagram showing a configuration example of a memory cell array according to the third embodiment.

FIG. 9 shows a configuration example of a memory cell array according to this embodiment. The memory cell array is divided into plural sectors SC0, SC1, and so on each including plural memory cells MC. Local bit lines LBL00, LBL01, LBL10, LBL11 are bit lines for connection to a memory cell MC in the sector SC0 and so on. Global bit lines GBL0, GBL1 extend across the plural sectors SC0, SC1, and so on and are bit lines for selective connection to one of the plural local bit lines LBL00 and so on, respectively.

In an n-channel MOS transistor 901, a gate is connected to a selection signal S00, a drain is connected to memory cells MC, and a source is connected to the global bit line GBL0. In an n-channel MOS transistor 902, a gate is connected to a selection signal S01, a drain is connected to memory cells MC, and a source is connected to the global bit line GBL1. In an n-channel MOS transistor 903, a gate is connected to a selection signal S10, a drain is connected to memory cells MC, and a source is connected to the global bit line GBL0. In an n-channel MOS transistor 904, a gate is connected to a selection signal S11, a drain is connected to memory cells MC, and a source is connected to the global bit line GBL1. In an n-channel MOS transistor 905, a gate is connected to a selection signal GBL-SEL, a drain is connected to the global bit line GBL0, and a source is connected to a bus DATA-BUS-0. In an n-channel MOS transistor 906, a gate is connected to the selection signal GBL-SEL, a drain is connected to the global bit line GBL1, and a source is connected to a bus DATA-BUS-1. In an n-channel MOS transistor 907, a gate is connected to a short signal SH, a drain and a source are connected to the global bit lines GBL0 and GBL1, respectively.

This memory cell array is divided into the plural sectors SC0, SC1, and so on, and the bit line BL is made into a hierarchy of the local bit lines LBL00, LBL01, LBL10, LBL11, and so on in the sector SC0 and so on and the global bit lines GBL0, GBL1 extending across plural sectors SC0 and so on. For example, when a memory cell MC located at the intersection of a word line WL00 and the local bit line LBL00 is selected, the word line WL00 is raised to a high electric potential. Subsequently, the selection signal S00 becomes H so as to connect the local bit line LBL00 to the global bit line GBL0, and further the selection signal GBL-SEL becomes H so as to connect the global bit line GBL0 to the bus DATA-BUS-0. At the same time, the selection signal S11 also becomes H to connect the local bit line LBL11 and the global bit line GBL1 to the bus DATA-BUS-1. Since the word lines WL10, WL11 remain L, memory cells MC connected to the local bit line LBL11 do not output memory cell information to the bus DATA-BUS-1. Thus, a sequence of the local bit line LBL00, the global bit line GBL0 and the bus DATA-BUS-0 and a sequence of the local bit line LBL11, the global bit line GBL1 and the data bus DATA-BUS-1 are formed, having a total parasitic resistance and a total parasitic capacitance which are almost equivalent. The former bus is used as a data bus, and a latter bus can be used as a reference bus since it does not output cell information. The used sectors SC0 and SC1 in a pair are sectors adjacent to each other.

When a memory cell MC connected to the local bit line LBL01 is selected, the selection signals S01 and S10 become H and a sequence of the local bit line LBL01, the global bit line GBL1 and the bus DATA-BUS-1 transmits memory cell information as the data bus, and a sequence of the local bit line LBL10, the global bit line GBL0 and the bus DATA-BUS-O is used as the reference bus.

When a memory cell MC connected to the local bit line LBL10 is selected, the selection signals S10 and S01 become H and the sequence of the local bit line LBL10, the global bit line GBL0 and the bus DATA-BUS-0 transmits memory cell information as the data bus, and the sequence of the local bit line LBL01, the global bit line GBL1 and the bus DATA-BUS-1 is used as the reference bus.

When a memory cell MC connected to the local bit line LBL11 is selected, the selection signals S11 and S00 become H and the sequence of the local bit line LBL11, the global bit line GBL1 and the bus DATA-BUS-1 transmits memory cell information as the data bus, and the sequence of the local bit line LBL00, the global bit line GBL0 and the bus DATA-BUS-0 is used as the reference bus.

As described above, when a memory cell in a first sector is selected, a first local bit line connected to the memory cell is connected to a first global bit line, and a second local bit line in a second sector that is different from the first sector is connected to a second global bit line. At this time, the combination of the first local bit line and the first global bit line is used as a data bus, and the combination of the second local bit line and the second global bit line is used as a reference bus.

In this embodiment, in order to completely eliminate an initial differential voltage between the buses DATA-BUS-0 and DATA-BUS-1, the n-channel MOS transistor 907 for short circuit of the global bit lines GBL0 and GBL1 is further provided. This transistor 907 is controlled by a short signal SH that becomes H at approximately the same timing as the activation pulse en-pls which activates the precharge circuit 101 and completely suppresses generation of a differential voltage in the pair of global bit lines GBL0 and GBL1 during a precharge period.

Figure 10:
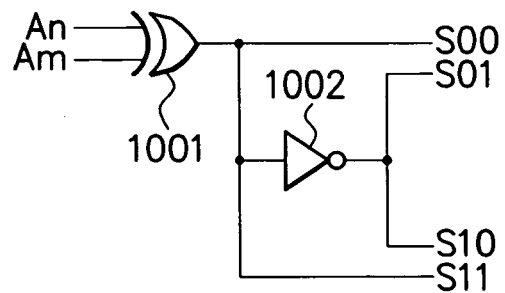
FIG. 10 is a diagram showing a local bit line selection signal generating circuit according to the third embodiment.

FIG. 10 shows a local bit line selection signal generating circuit for generating the selection signals S00, S01, S10 and S11 in FIG. 9. An exclusive logical sum circuit 1001 inputs addresses An and Am and outputs an exclusive logical sum of them. An inverter 1002 inputs the output of the exclusive logical sum circuit 1001 and outputs a logically inverted signal thereof. The output of the exclusive logical sum circuit 1001 becomes the selection signals S00 and S11. The output of the inverter 1002 becomes the selection signals S01 and S10.

The address An is an address for selecting the global bit line GBL0 by L and selecting the global bit line GBL1 by H. The address Am is an address for selecting the sector SC0 by L and selecting the sector SC1 by H. When a memory cell connected to the local bit line LBL00 is selected, Am and An become L, and the selection signals S00 and S11 become H by an exclusive logical sum of the both. When selecting a cell connected to the local bit line LBL11, Am and An become H, and the selection signals S00 and S11 also become H by an exclusive logical sum of the both. In other cases, the selection signals S01 and S10 become H.

Figure 11:
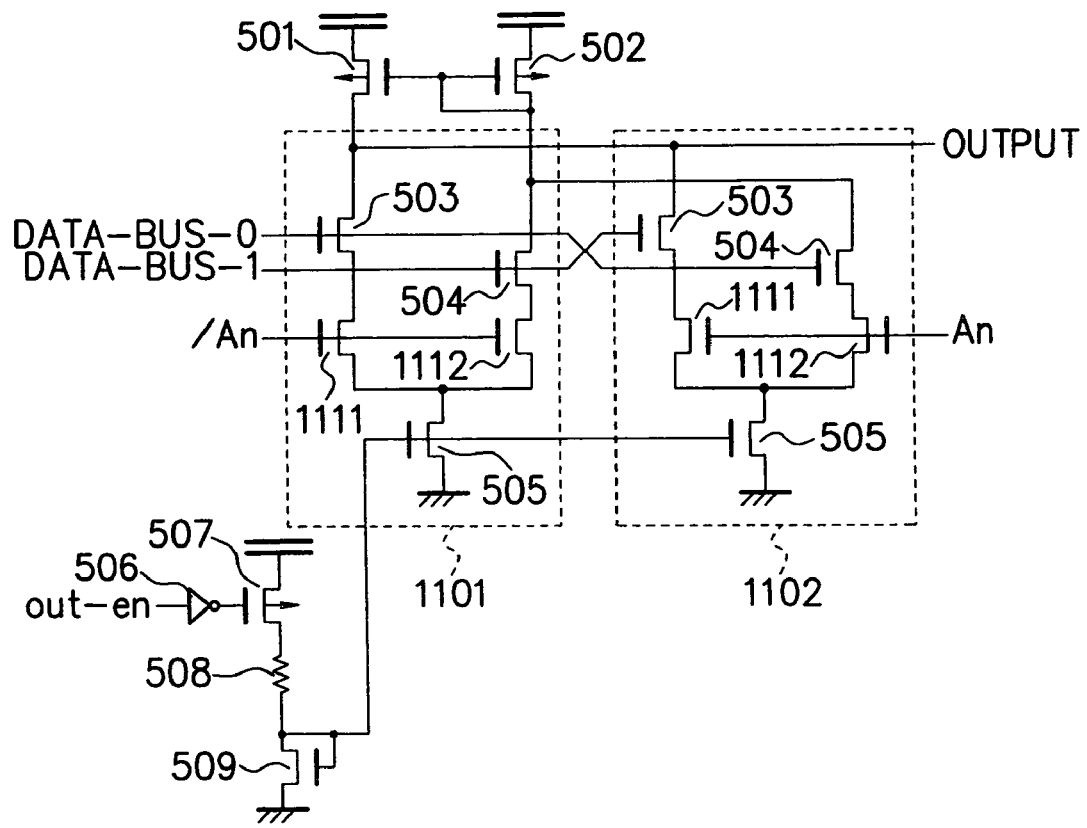
FIG. 11 is a circuit diagram showing an example of a differential amplifier circuit according to the third embodiment.

FIG. 11 shows a configuration example of the differential amplifier circuit 103 (FIG. 1) in this embodiment. Hereinafter, only different points of this differential amplifier circuit from the differential amplifier circuit in FIG. 5 are described. Amplification units 1101 and 1102 have the same configuration and are arranged in parallel. First, the configuration of the amplification unit 1101 will be described. In a transistor 503, a gate is connected to a bus DATA-BUS-0, and a drain thereof is connected to a drain of the transistor 501. In an n-channel MOS transistor 1111, a gate is connected to an address /An, a drain is connected to a source of the transistor 503, and a source is connected to a drain of a transistor 505. In a transistor 504, a gate is connected to a bus DATA-BUS-1 and a drain is connected to a drain of a transistor 502. In an n-channel MOS transistor 1112, a gate is connected to the address /An, a drain is connected to a source of the transistor 504, and a source is connected to the drain of the transistor 505.

Next, the configuration of the amplification unit 1102 will be described. A gate of a transistor 503 is connected to the bus DATA-BUS-1, and a gate of a transistor 504 is connected to the bus DATA-BUS-0. Further, gates of transistors 1111 and 1112 are connected to an address An. Other points of the amplification unit 1102 are the same as in the amplification unit 1101.

In this embodiment, there are cases of outputting memory cell information to the bus DATA-BUS-0 and outputting memory cell information to the bus DATA-BUS-1, and which bus information to be outputted to the output line OUTPUT should be selected according to the addresses. When the bus DATA-BUS-0 is selected, the address An is L, and therefore the address /An that is the inverted signal thereof becomes H to transmit data to the output line OUTPUT with the bus DATA-BUS-0 being a data bus and the bus DATA-BUS-1 being a reference bus. In reverse, when the bus DATA-BUS-1 is selected, the address An is H, and thus data is transmitted to the output line OUTPUT with the bus DATA-BUS-1 being the data bus and the bus DATA-BUS-0 being the reference bus.

Incidentally, the selection signal SEL0 in FIG. 8 may be the same signal as the address /An, and the selection signal SEL1 may be the same signal as the address An.

As described above, by the combinations of the circuits shown in FIG. 8 to FIG. 11, it is possible to construct a semiconductor memory device capable of performing a sense operation at high speed without being affected by a parasitic resistance and a parasitic capacitance in a data bus and a reference bus.

According to the first to third embodiments, by applying a first constant current to a data bus and applying a second constant current which is smaller than the first constant current to a reference bus, a differential voltage between the data bus and the reference bus becomes large quickly and a time for the sense circuit to produce an output becomes fast, so that an access speed can be accelerated. Further, since an ordinary memory cell is used, the access speed of a non-volatile semiconductor memory device can be improved without causing any cost increase in manufacturing steps.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

INDUSTRIAL APPLICABILITY

By applying a first constant current to a data bus and applying a second constant current which is smaller than the first constant current to a reference bus, a differential voltage between the data bus and the reference bus becomes large quickly and a time for a memory device to produce an output becomes fast, so that an access speed can be accelerated. Further, since an ordinary memory cell is used, the access speed of a memory device can be improved without causing any cost increase in manufacturing steps.

What is claimed is:

1. A memory device, comprising:
   a data line for connection to a memory cell;
   a reference line for reference;
   a precharge circuit connected to said data line and said reference line and configured to precharge said data line and said reference line;
   a load circuit connected to said data line and said reference line and configured to apply a first constant current to said data line and apply a second constant current which is smaller than the first constant current to said reference line; and
   an amplification circuit connected to said data line and said reference line and configured to amplify a differential voltage between said data line and said reference line.

2. The memory device according to claim 1, wherein said load circuit applies the first constant current to said data line and applies the second constant current to said reference line during and after precharge of said precharge circuit.

3. The memory device according to claim 2, wherein after the precharge of said precharge circuit, the first constant current flows in said data line, and the second constant current flows in said reference line.

4. The memory device according to claim 2, wherein said precharge circuit is activated by a one-shot pulse.

5. The memory device according to claim 1, wherein said load circuit applies the first constant current to said data line regardless of the electric potential of said data line and applies the second constant current to said reference line regardless of the electric potential of said reference line.

6. The memory device according to claim 1, wherein said precharge circuit includes a plurality of field effect transistors and performs precharge by supplying a voltage of integral multiple of one or more of a threshold voltage of the field effect transistors to said data line and said reference line.

7. The memory device according to claim 6, wherein said precharge circuit comprises:
   a plurality of first field effect transistors configured to generate a voltage of integral multiple of two or more times of the threshold voltage of said plurality of field effect transistors and whose gate and drain are connected to each other; and
   a second field effect transistor whose gate receives the voltage of integral multiple of two or more times and whose source is connectable to said data line and said reference line.

8. The memory device according to claim 6, wherein said amplification circuit comprises two field effect transistors in which said data line and said reference line are connected to gates thereof respectively.

9. The memory device according to claim 1, wherein the second constant current is ½ of the first constant current.

10. The memory device according to claim 9, wherein said load circuit comprises:
    an element configured to pass the first constant current;
    a first mirror circuit configured to apply a first constant current which is the same as the current flowing in said element to said data line; and
    a second mirror circuit configured to apply a second current which is ½ of the first constant current flowing in said element to said reference line.

11. The memory device according to claim 10, wherein said element is a resistor.

12. The memory device according to claim 10, wherein said element is a dummy memory cell having the same structure as the memory cell.

13. The memory device according to claim 12, wherein each of said dummy memory cell and the memory cell is a nonvolatile memory cell having a gate, a source and a drain.

14. The memory device according to claim 13, wherein when said load circuit is activated, the same voltages as a gate, a source and a drain of the memory cell being selected is applied to the gate, the source and the drain of said dummy memory cell, respectively.

15. The memory device according to claim 1, further comprising:
    a first path configured to transmit information of a first memory cell; and
    a second path configured to transmit information of a second memory cell, the second path being different from said first path,
    wherein when the first memory cell is selected, said first path is used as said data line and said second path is used as said reference line, and when the second memory cell is selected, said second path is used as said data line and said first path is used as said reference line.

16. The memory device according to claim 15, further comprising:
    a memory cell array divided into a plurality of sectors each including a plurality of memory cells;
    a plurality of local bit lines for connection to the plurality of memory cells in the sectors; and
    a first and second global bit lines for selective connection to one of said plurality of local bit lines respectively, said first and second global bit lines extending across the plurality of sectors,
    wherein when a memory cell in a first sector is selected, a first local bit line connected to the memory cell is connected to said first global bit line, and a second local bit line in a second sector which is different from the first sector is connected to said second global bit line, and
    wherein a combination of said first local bit line and said first global bit line is used as said data line, and a combination of said second local bit line and said second global bit line is used as said reference line.

17. The memory device according to claim 16, wherein the first sector and the second sector are sectors adjacent to each other.

18. The memory device according to claim 17, further comprising an arithmetic circuit configured to calculate an exclusive logical sum of a signal for distinguishing the first sector and the second sector and a signal for distinguishing said first global bit line and said second global bit line so as to connect said local bit line and said global bit line.

19. The memory device according to claim 1, wherein the memory cell is connected to a word line and a bit line, and the bit line is connected to said data line according to an address.

20. The memory device according to claim 1, wherein the memory cell is a nonvolatile memory cell.

* * * * *